United States Patent
Mays

(10) Patent No.: US 11,223,885 B2
(45) Date of Patent: Jan. 11, 2022

(54) THERMAL CONTROL SYSTEM WITH PASSIVE THERMOSTATIC ACTUATORS FOR PASSIVE THERMAL MANAGEMENT OF PLUGGABLE OPTICS IN AN OPTICAL TELECOM PLATFORM

(71) Applicant: Ciena Corporation, Hanover, MD (US)

(72) Inventor: Russell P. Mays, Stockton, CA (US)

(73) Assignee: Ciena Corporation, Hanover, MD (US)

(*) Notice: Subject to any disclaimer, the term of this patent is extended or adjusted under 35 U.S.C. 154(b) by 281 days.

(21) Appl. No.: 16/653,104

(22) Filed: Oct. 15, 2019

(65) Prior Publication Data

US 2021/0112315 A1    Apr. 15, 2021

(51) Int. Cl.
| | |
|---|---|
| H04J 14/00 | (2006.01) |
| H04Q 1/02 | (2006.01) |
| H05K 7/20 | (2006.01) |
| G02B 6/42 | (2006.01) |
| G02B 6/35 | (2006.01) |

(52) U.S. Cl.
CPC .......... *H04Q 1/035* (2013.01); *G02B 6/4268* (2013.01); *H05K 7/2049* (2013.01); *G02B 6/3564* (2013.01); *H04Q 2201/804* (2013.01)

(58) Field of Classification Search
CPC ............. H04Q 1/035; H04Q 2201/804; H05K 7/2049; G02B 6/4268; G02B 6/3564; G02B 6/4441
See application file for complete search history.

(56) References Cited

U.S. PATENT DOCUMENTS

| | | | | |
|---|---|---|---|---|
| 6,921,277 B2* | 7/2005 | Murr | ...................... | H01L 23/40 |
| | | | | 257/E23.083 |
| 8,333,598 B2* | 12/2012 | Mulfinger | ............ | H01R 12/737 |
| | | | | 439/67 |
| 9,912,107 B2* | 3/2018 | Bucher | ................ | H01R 24/60 |
| 10,374,341 B1* | 8/2019 | Phillips | ............... | H01R 12/721 |
| 10,401,581 B2* | 9/2019 | Gaal | .................... | G02B 6/4261 |
| 10,877,230 B1* | 12/2020 | Graham | .............. | G02B 6/4269 |
| 2017/0269314 A1* | 9/2017 | Gaal | .................. | H05K 7/20563 |

* cited by examiner

*Primary Examiner* — Ellen E Kim
(74) *Attorney, Agent, or Firm* — Clements Bernard Baratta; Lawrence A. Baratta, Jr.; Christopher L. Bernard

(57) ABSTRACT

A thermal control system for pluggable optics in an optical telecom platform. The thermal control system comprises a thermal interface and one or more actuators. The thermal interface is configured to dissipate heat from a pluggable optical module in the optical telecom platform. The one or more actuators configured to change a position of the pluggable optical module relative to the thermal interface such that a thermal resistance between the pluggable optical module and the thermal interface is different based on a position of the pluggable optical module relative to the thermal interface.

20 Claims, 14 Drawing Sheets

THERMAL CONTROL SYSTEM WITH PASSIVE THERMOSTATIC ACTUATORS FOR PASSIVE THERMAL MANAGEMENT OF PLUGGABLE OPTICS IN AN OPTICAL TELECOM PLATFORM

FIELD OF THE DISCLOSURE

The present disclosure generally relates to networking equipment. More particularly, the present disclosure relates to an optical telecom platform with pluggable optics and thermal management thereof.

BACKGROUND OF THE DISCLOSURE

An insatiable appetite for network resources, the growing number of Internet connections, ever-faster media streaming devices and the escalation of high-definition mobile video are together burdening already overtaxed cable networks. In the cable world, these applications require huge amounts of bandwidth coupled with low latency. What's more, the supporting infrastructure must offer the flexibility to cope with steadily increasing dynamic traffic flows. Accordingly, most cable operators are looking to a "Fiber Deep" architecture, which is an end-to-end solution combining packet switching and aggregation alongside coherent optical technology. In this case, Hybrid Fiber Coax (HFC) architectures are transformed and coexist with modern digital fiber and packet technologies. The term "Fiber Deep" has been used to describe an approach that empowers a forward-looking, universal access framework that includes Data Over Cable Service Interface Specification (DOCSIS), Remote PHY devices (RPD), point-to-point 10G, and higher fiber-based business services, variants of Passive Optical Network (xPON), small cells and finally Converged Haul 4G and 5G New Radio (NR) mobility futures.

As well, thermal management for high-speed optical networking equipment is a challenge. In a controlled environment, thermal management is achieved through air flow, vents in a chassis, fans, design choices, etc. For example, some work has focused on managing air flow to enable back-to-back shelf configurations, i.e., front or side airflow only, which is advantageous in Central Offices (CO), data centers, etc. However, these deployments are all in a controlled environment, e.g., air conditioning, no exposure to the environment, etc.

The use of pluggable optical modules is common in high-speed optical networking equipment deployed in a controlled environment. Numerous techniques for thermal management of pluggable optical modules exist, but they focus primarily on keeping the pluggable optical modules cool, such as by forced air flow driven by cooling fans. Outside plant equipment that is deployed in sealed housings, such as hardened optical platforms, can operate in both high ambient temperature conditions and low ambient temperature conditions. With no air flow around the module, heat must be conducted to the housing by means of a thermal interface, such as thermal interface material, a heatsink, a heat pipe, a vapor chamber, or combinations thereof. However, pluggable optical modules have minimum operating temperatures, such as temperatures below −20° C., and thus, heat dissipation from the pluggable optical modules operating in low ambient temperature conditions can result in operating temperatures of the pluggable optical modules dropping below the minimum. Successful operation of a pluggable optical module can therefore require both increased heat dissipation to keep the module at or below its maximum operating temperature in high ambient temperature conditions and increased thermal resistance to the ambient while operating in low ambient conditions to keep the module at or above its minimum operating temperature. Furthermore, pluggable optical modules may require preheating when ambient temperatures are at an extreme.

BRIEF SUMMARY OF THE DISCLOSURE

In an embodiment, a thermal control system for pluggable optics in an optical telecom platform includes a thermal interface and one or more actuators. The thermal interface is configured to dissipate heat from a pluggable optical module in the optical telecom platform. The one or more actuators is configured to change a position of the pluggable optical module relative to the thermal interface such that a thermal resistance between the pluggable optical module and the thermal interface is different based on a position of the pluggable optical module relative to the thermal interface.

The one or more actuators can be configured to cause the pluggable optical module to be pressed against the thermal interface when the temperature is above an activation temperature and to cause the pluggable optical module to move such that the pluggable optical module is separated from the thermal interface when the temperature is below the activation temperature. The thermal interface can comprise a thermal interface material configured to be in direct or indirect contact with an enclosure of the optical telecom platform, and can comprise a contact layer to prevent adhesion between the thermal interface and the pluggable optical module. The one or more actuators can each comprise a thermostatic actuator configured to actuate at or about an activation temperature. The one or more actuators can each include a body and a control material held within the body, the body being embedded in an optic carrier that holds the pluggable optical module, and the control material being a material that expands and contracts at or about an activation temperature.

The thermal control system can further comprise one or more contact springs configured to push the pluggable optical module towards the thermal interface, and one or more return springs configured to push the pluggable optical module away from the thermal interface. When the temperature is above the activation temperature the one or more contact springs, the one or more return springs, and the one or more actuators can be configured such that a spring force of the one or more contact springs is greater than a spring force of the one or more return springs, causing the pluggable optical module to be pressed onto the thermal interface, and when the temperature reaches at or about an activation temperature the one or more actuators is actuated and the one or more contact springs, the one or more return springs, and the one or more actuators can be configured such that the spring force of the one or more contact springs is less than the spring force of the one or more return springs, causing the pluggable optical module to be pushed away from the thermal interface until an equilibrium is reached between the spring forces of the one or more contact springs and the one or more return springs. The thermal control system can further include a gantry frame configured to attach to an enclosure of the optical telecom platform. The one or more contact springs can be configured to connect the optic carrier, via the one or more actuators, to the gantry frame, and the one or more return springs can be configured to connect the optic carrier to the enclosure.

In another embodiment, a method for thermally controlling a pluggable optical module in an optical telecom platform is disclosed. The method includes providing a thermal interface configured to dissipate heat from a pluggable optical module in the optical telecom platform. The method further includes providing one or more actuators configured to change a position of the pluggable optical module relative to the thermal interface. The method yet further includes actuating the one or more actuators to change the position of the pluggable optical module such that a thermal resistance between the pluggable optical module and the thermal interface is different based on a position of the pluggable optical module relative to the thermal interface.

In a further embodiment, an optical telecom platform including a module carrier, a thermal interface, one or more actuators, and a housing is disclosed. The module carrier is configured to receive a pluggable optical module. The thermal interface is configured to dissipate heat from a pluggable optical module held by the module carrier. The one or more actuators configured to change a position of the module carrier and the pluggable optical module relative to the thermal interface such that a thermal resistance between the pluggable optical module and the thermal interface is different based on a position of the pluggable optical module relative to the thermal interface. And the housing encloses the module carrier, and the housing covers the module carrier with the pluggable optical module, the thermal interface, and the one or more actuators, with respect to airflow.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Figure 1:
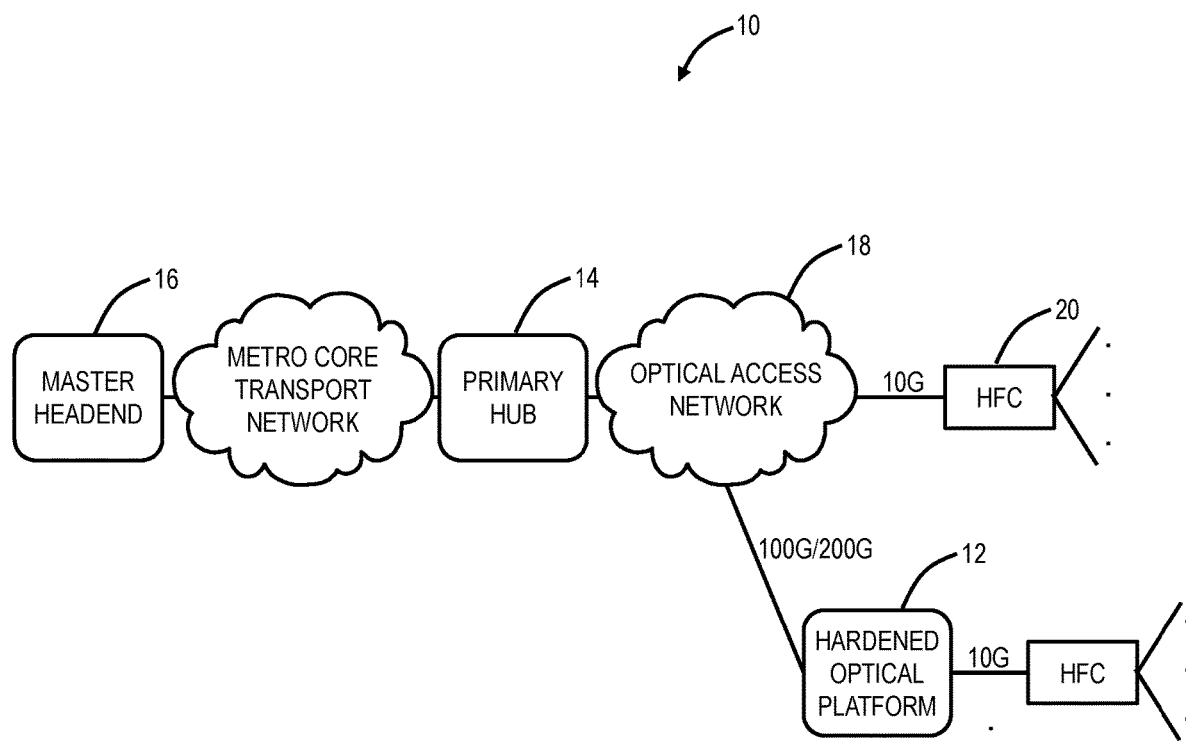
FIG. 1 is a network diagram of a network utilizing a hardened optical platform in a so-called "Fiber Deep" architecture.

In various embodiments, the present disclosure relates to an optical telecom platform, such as a hardened optical platform, with pluggable optics with a thermal control system. The optical telecom platform contemplates deployment in an outdoor plant system or the like. By hardened, the hardened optical platform is designed to be placed anywhere in the telecommunications environment, including any climate and any outdoor or indoor mounting. Thus, the hardened optical platform is sealed from harmful ingress, such as water. It is durable from corrosion, even in high-salt environments. Importantly, the hardened optical platform does not have air flow, vents, etc. permitting air exchange with the exterior.

The optical telecom platform supports pluggable optical modules with a thermal control system that includes a thermal interface and one or more actuators. The thermal interface dissipates heat from the pluggable optics to an enclosure of the optical telecom platform while the pluggable optics are in thermal contact with the thermal interface. The actuators are configured to maintain contact between the pluggable optics and the thermal interface when a temperature is above an activation temperature and to separate the pluggable optics from the thermal interface when the temperature is below an activation temperature.

By so doing, heat can be dissipated from the pluggable optics to maintain the operating temperature of the pluggable optics below the maximum operating temperature of the pluggable optics while the temperature is above the activation temperature, such as in average and high ambient temperature conditions. And heat can be retained in the pluggable optics to maintain the operating temperature above the minimum operating temperature of the pluggable optics while the temperature is below the activation temperature, such as in low ambient temperature conditions.

Coherent Optics

Coherent optical technology uses a Digital Signal Processor (DSP) at both the transmitter and receiver, higher bit-rates, providing greater degrees of flexibility, simpler photonic line systems, and better optical performance. Fiber types and fiber impairments can be compensated for, leading to fewer regenerators and amplifiers, lowering costs, increasing transmission di stances and adding traffic-handling capacity. Coherent optics can be implemented in either an integrated or pluggable optical module form factors. In the integrated approach, vendors customize solutions with their own technology and benefits. Pluggable coherent technologies can be split into two basic types: Analog Coherent Optics (ACO) and Digital Coherent Optics (DCO). ACOs consume less power by removing DSP functionality (and its hardware) from the pluggable optical module. The pluggable optical module communicates with the carrier circuit board using analog signals via a special connector and is where the DSP functionality resides. DCOs have the DSP function embedded within the pluggable optical module. This approach makes them more compatible with other vendors but consumes more power and has less vendor-specific technology.

For its part, coherent packet-optical combines the power of coherent optical transmission technology with packet fabric-based switching. It simplifies the network design and operations by eliminating the cost and complexity associated with deploying separate and physically distinct packet and optical platforms. It also facilitates future Distributed Access Architecture (DAA) and legacy Converged Cable Access Platform (CCAP) support.

"Fiber Deep"

FIG. 1 is a network diagram of a network 10 utilizing a hardened optical platform 12 in a so-called "Fiber Deep" architecture. Generally, the "Fiber Deep" architecture relates to including coherent optics closer to end users, including in outside plant configurations requiring the hardened optical platform 12. That is, the "Fiber Deep" architecture includes movement of fiber ever closer to customers requiring placement of the hardened optical platform 12 in non-controlled environments, i.e., outdoors.

The hardened optical platform 12 enables the use of pluggable optical modules (include ACO, DCO, and the like) in an outside plant deployment, such as the "Fiber Deep" architecture. Using the hardened optical platform 12, cable operators or the like can offer flexibility to boost fiber capacity to deliver more bandwidth and scalability between a hub 14 and headend 16 locations, and an optical access network 18 right to the network edge. Specifically, the optical access network 18 can connect directly to Hybrid Fiber Coax (HFC) devices 20, or through the hardened optical platform 12 to extend the fiber bandwidth such as support 100G/200G or more in the optical access network 18. In practical implementations, networking gear is targeted at one of two environments—commercial or industrial. Commercial environments are typically controlled, while industrial environments are referred to as "temperature hardened" or outdoor. Cable operators operate in both environments, using both outdoor cabinet and pole applications.

In an embodiment, the hardened optical platform 12 can be pole/strand-mounted and it can be a network element supporting modular packet and Optical Transport Networking (OTN) switching in the network 10. For example, the hardened optical platform 12 can support 24×10G client ports (facing the HFC, for example) and 2×100G/200G line ports (facing the optical access network 18).

Those skilled in the art will recognize the network 10 is presented for illustration purposes as one possible application for the hardened optical platform 12 described herein. Other embodiments are also contemplated. The objective of the hardened optical platform 12 is to provide a hardened platform that supports pluggable optical modules including coherent optics such as ACO, DCO, etc. such that these pluggable optical modules can be deployed outside of controlled environments.

Hardened Optical Platform

Figure 2:
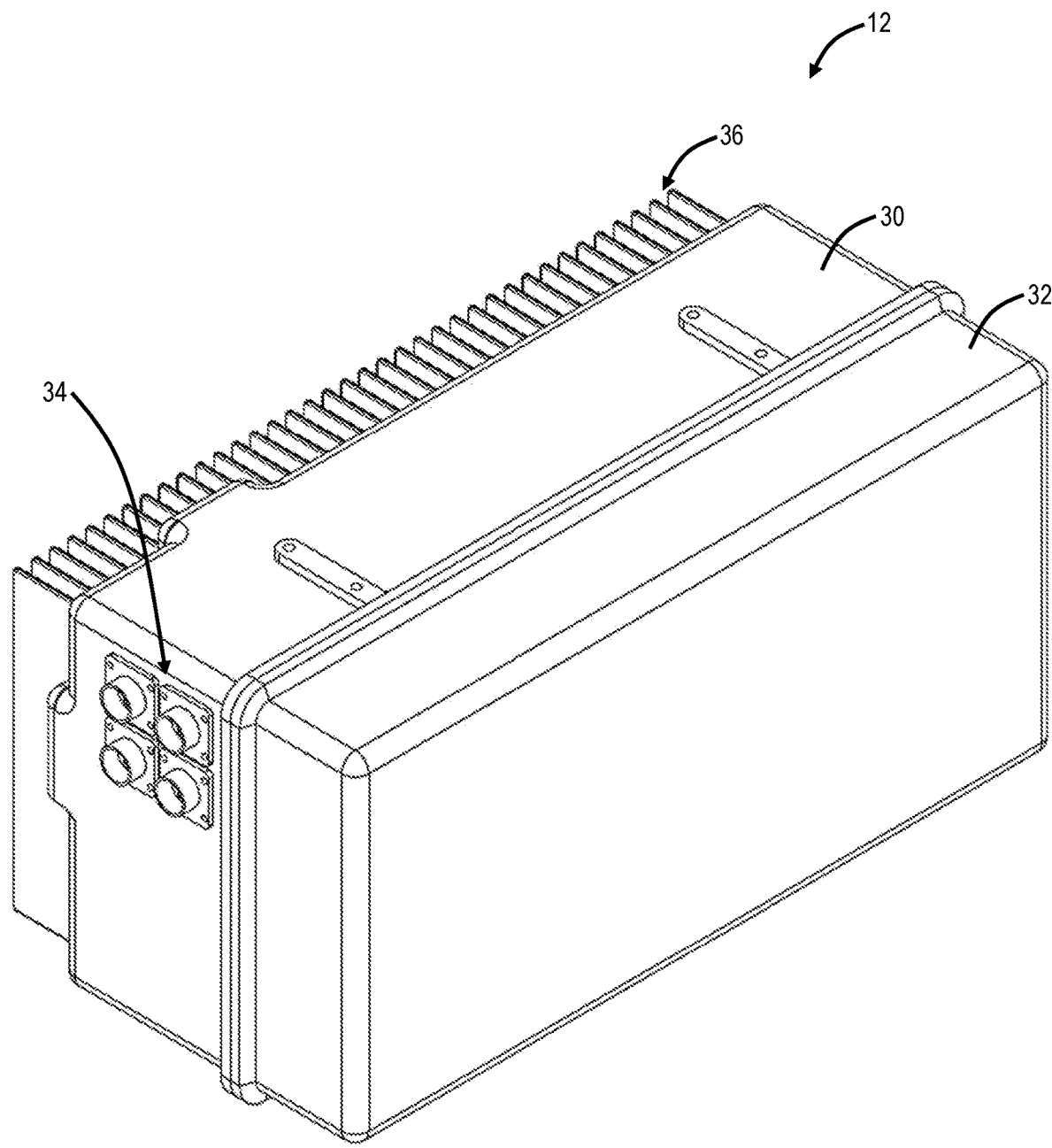
FIG. 2 is a perspective diagram of the enclosure of the hardened optical platform with a door closed.
Figure 3:
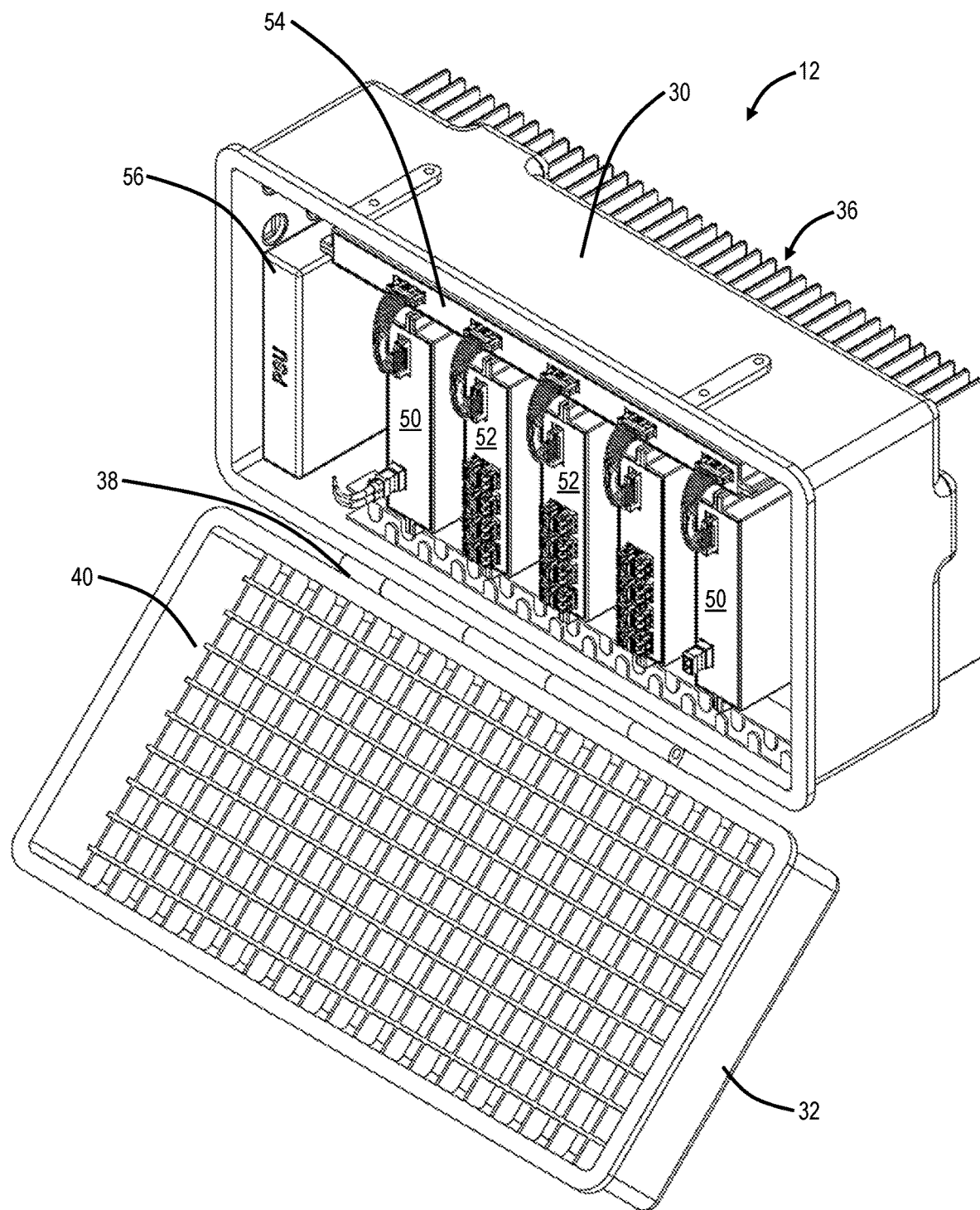
FIG. 3 is a perspective diagram of the enclosure of the hardened optical platform with the door open.
Figure 4:
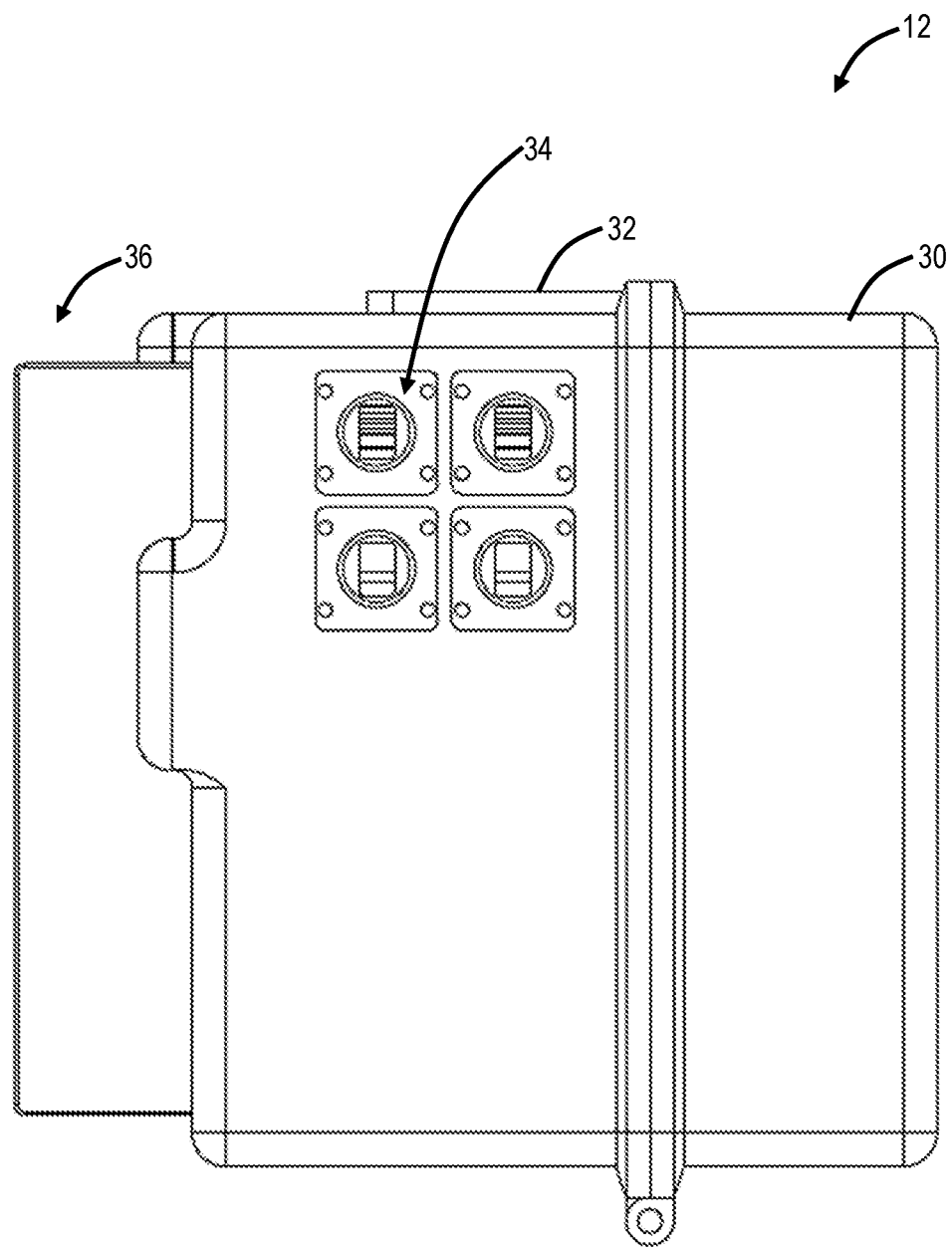
FIG. 4 is a side view diagram of the enclosure of the hardened optical platform illustrating fiber and power access ports in the enclosure.
Figure 5:
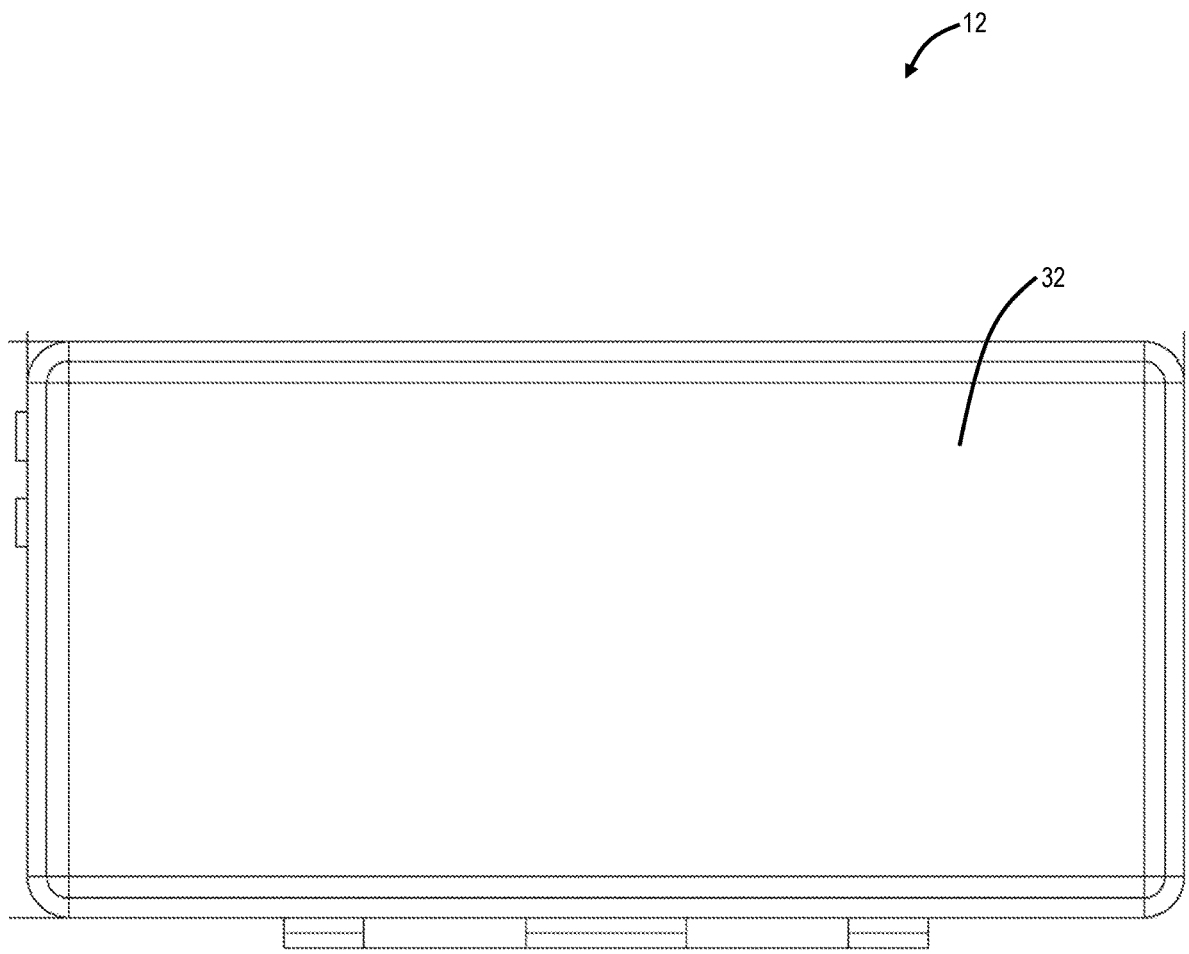
FIG. 5 is a front view diagram of the door of the hardened optical platform.
Figure 6:
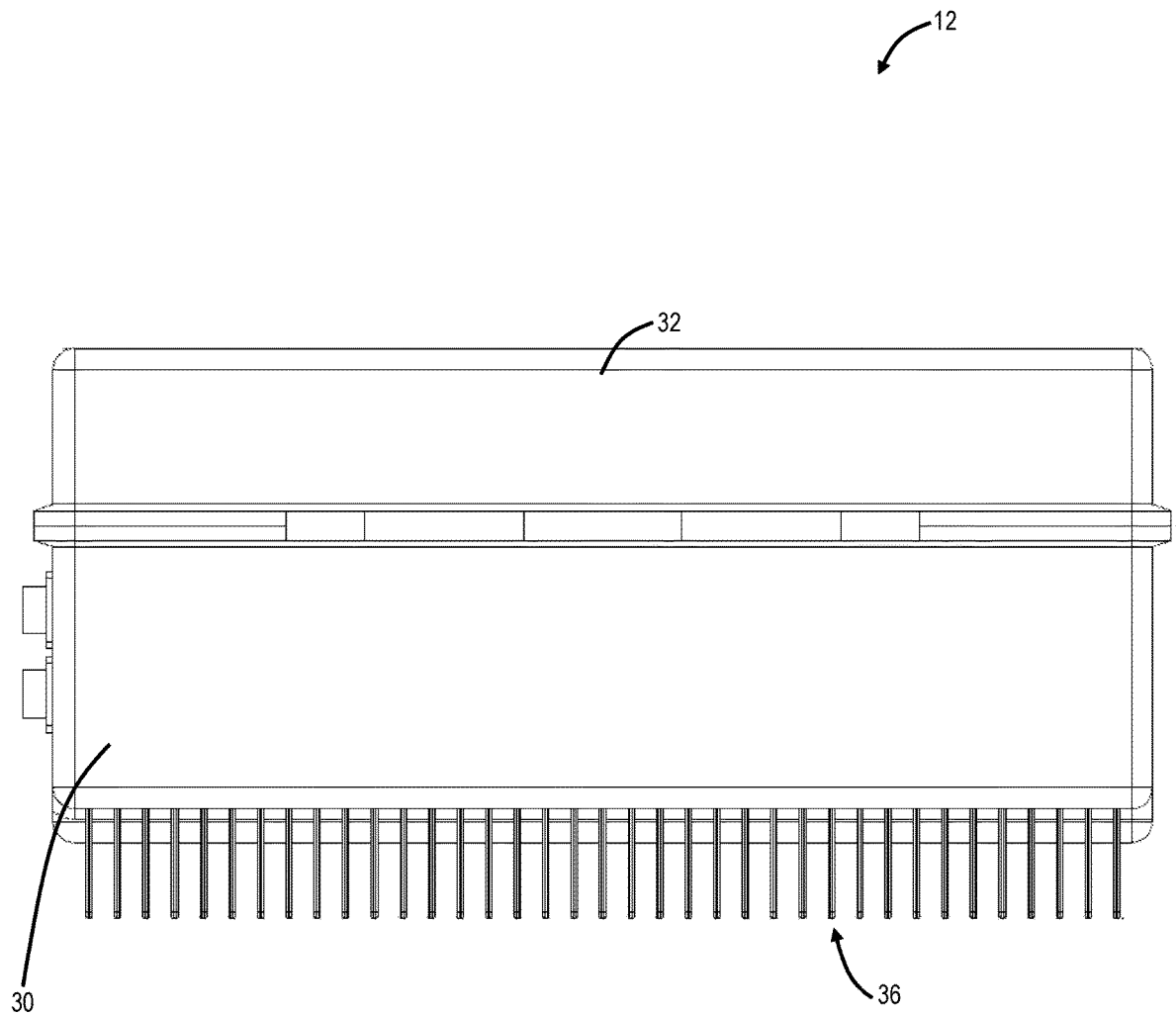
FIG. 6 is a top view diagram of the enclosure of the hardened optical platform with the door closed.
Figure 7:
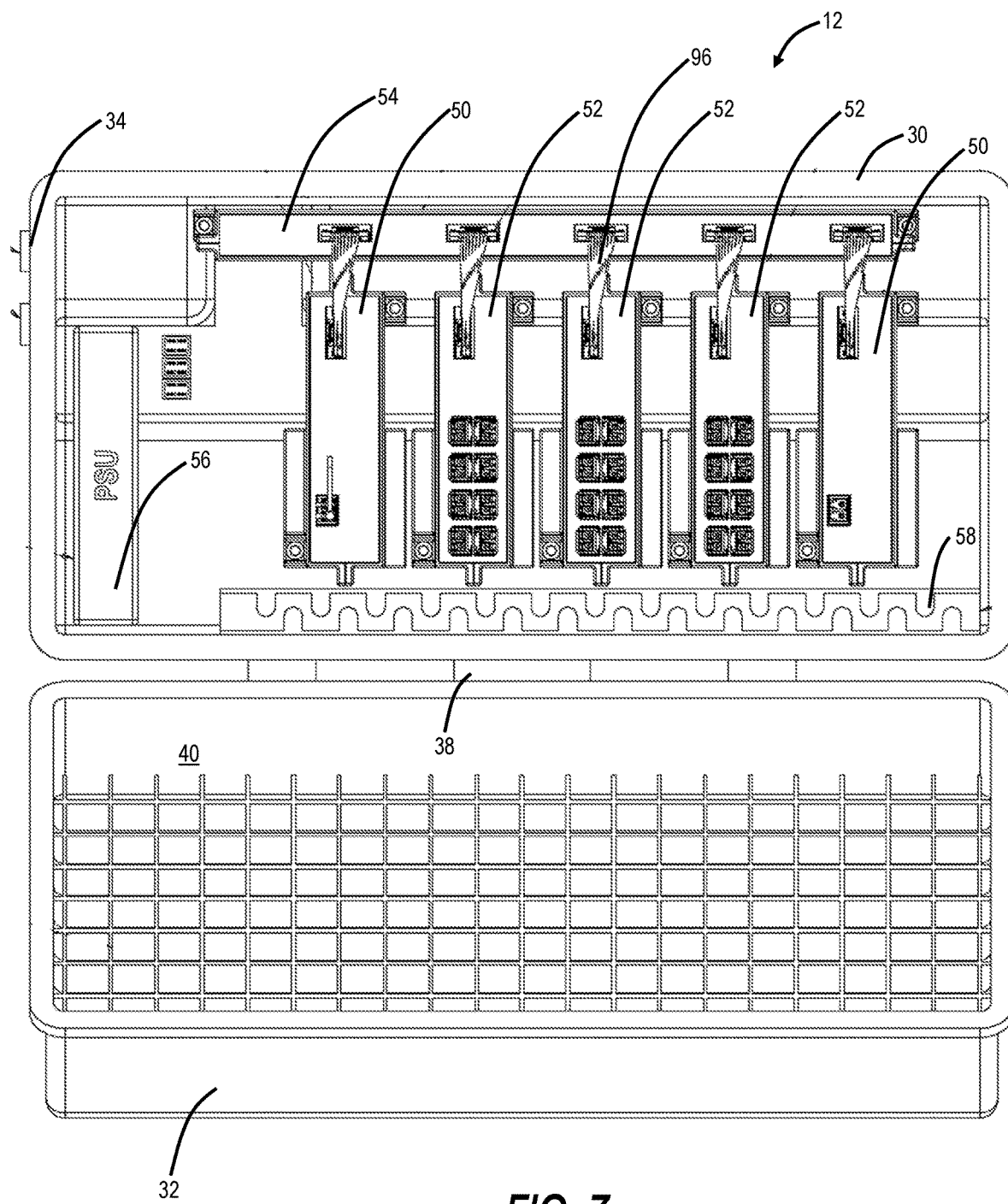
FIG. 7 is a front view diagram of the hardened optical platform with the door open.

FIGS. 2-7 are diagrams of an enclosure 30 of the hardened optical platform 12. Specifically, FIG. 2 is a perspective diagram of the enclosure 30 of the hardened optical platform 12 with a door 32 closed, FIG. 3 is a perspective diagram of the enclosure 30 of the hardened optical platform 12 with the door 32 open, FIG. 4 is a side view diagram of the enclosure 30 of the hardened optical platform 12 illustrating fiber and power access ports 34 in the enclosure 30, FIG. 5 is a front view diagram of the door 32 of the hardened optical platform 12, FIG. 6 is a top view diagram of the enclosure 30 of the hardened optical platform 12 with the door 32 closed, and FIG. 7 is a front view diagram of the hardened optical platform 12 with the door 32 open.

The hardened optical platform 12 includes the enclosure 30 and the door 32 which can be any hardened material, i.e., which is environmentally sealed to water, wind, etc. Specifically, the hardened optical platform 12, via the enclosure 30 and the door 32, is weatherproof. The enclosure 30 can include the fiber and power access ports 34 on a side enabling cables to be routed into the interior. In an embodiment, the enclosure 30 is fixed, and the door 32 can rotatably open for interior access. The enclosure 30 can also include heat fins 36 on a rear portion to move heat generated in the interior to the environment via convection. Again, there is no airflow between the interior and the environment.

In an embodiment, the hardened optical platform 12 can be mounted on a pole or the like. In another embodiment, the hardened optical platform 12 can be placed on a pedestal or some other outdoor location. In a further embodiment, the hardened optical platform 12 can be mounted on a building exterior or the like.

In an embodiment, the hardened optical platform 12 can have a rectangular shape. Example dimensions can include 270 mm×540 mm×270 mm (H×W×D). For example, the hardened optical platform 12 can have a similar size/functionality of a 1-2 Rack Unit (RU) mountable system (e.g., a "pizza box").

In FIGS. 3 and 7, the door 32 is shown open. The door 32 can open and rotate downward about a hinge 38 on a front of the enclosure 30. A front cover 40 of the door 32 can include space and guides for fiber management and fiber splicing.

The hardened optical platform 12 can include various modules which can be field replaceable. Again, in FIGS. 3 and 7, the modules can include a line module 50, a client module 52, switch module 54, and a power supply unit (PSU) 56. Of course, other types of modules are contemplated. Also, the hardened optical platform 12 can include a fiber tray 58 located underneath the modules 50, 52 for fiber slack routing and storage.

The hardened optical platform 12 can operate with or without a backplane. In this example, there is both a backplane (FIG. 13) and cable connections between the modules 50, 52 and the switch module 54. Again, other embodiments are also contemplated.

Hardened Optical Platform Modules

Figure 8:
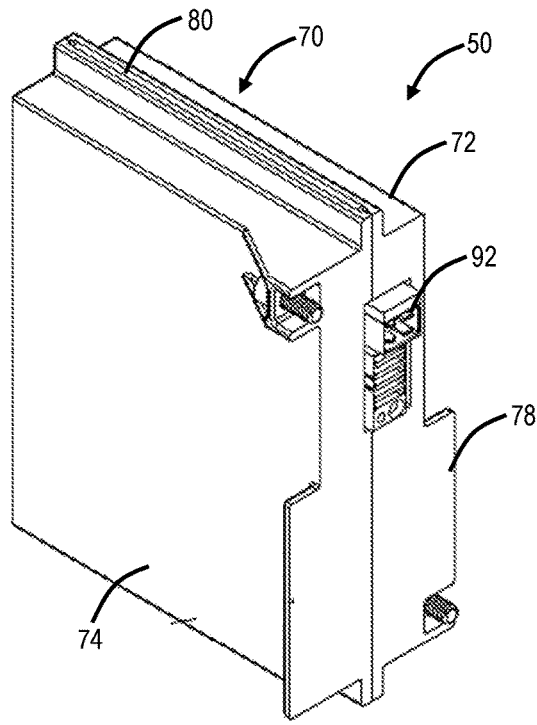
FIG. 8 is a perspective diagram of a front and rear view of a line module for the hardened optical platform.
Figure 8:
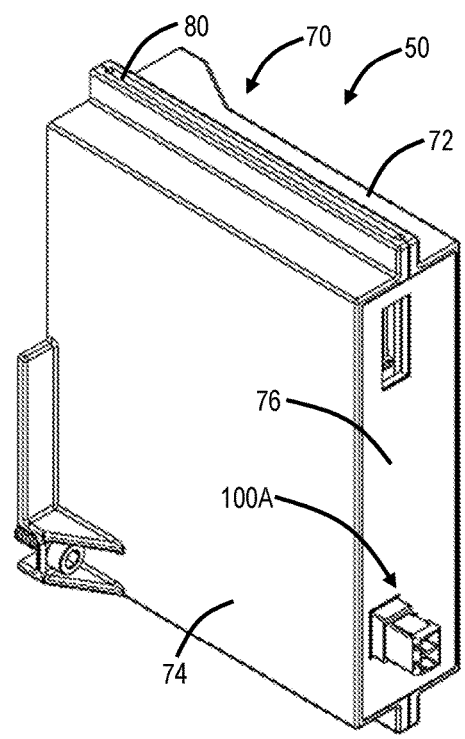
Figure 9:
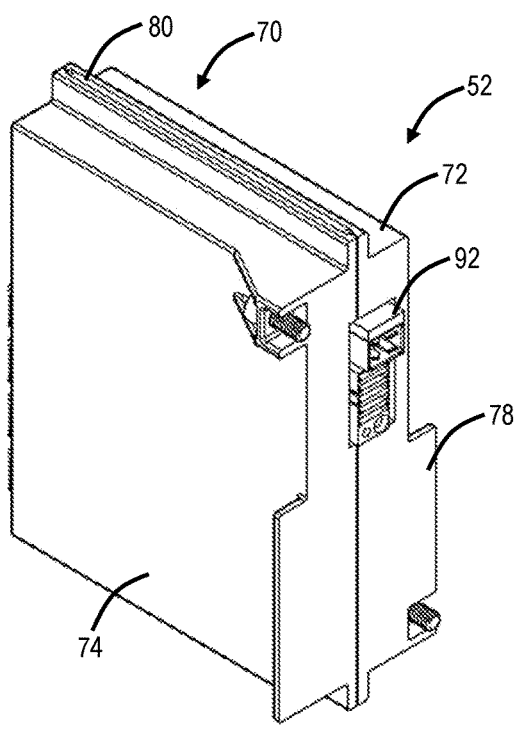
FIG. 9 is a perspective diagram of a front and rear view of a client module for the hardened optical platform.
Figure 9:
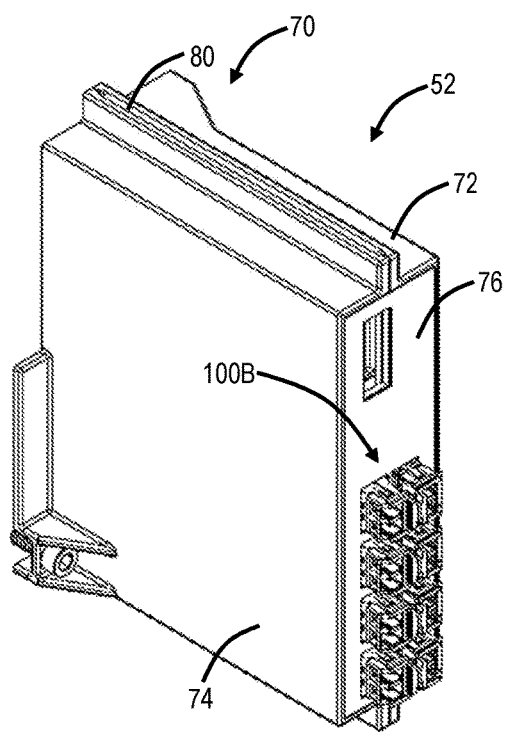
Figure 10:
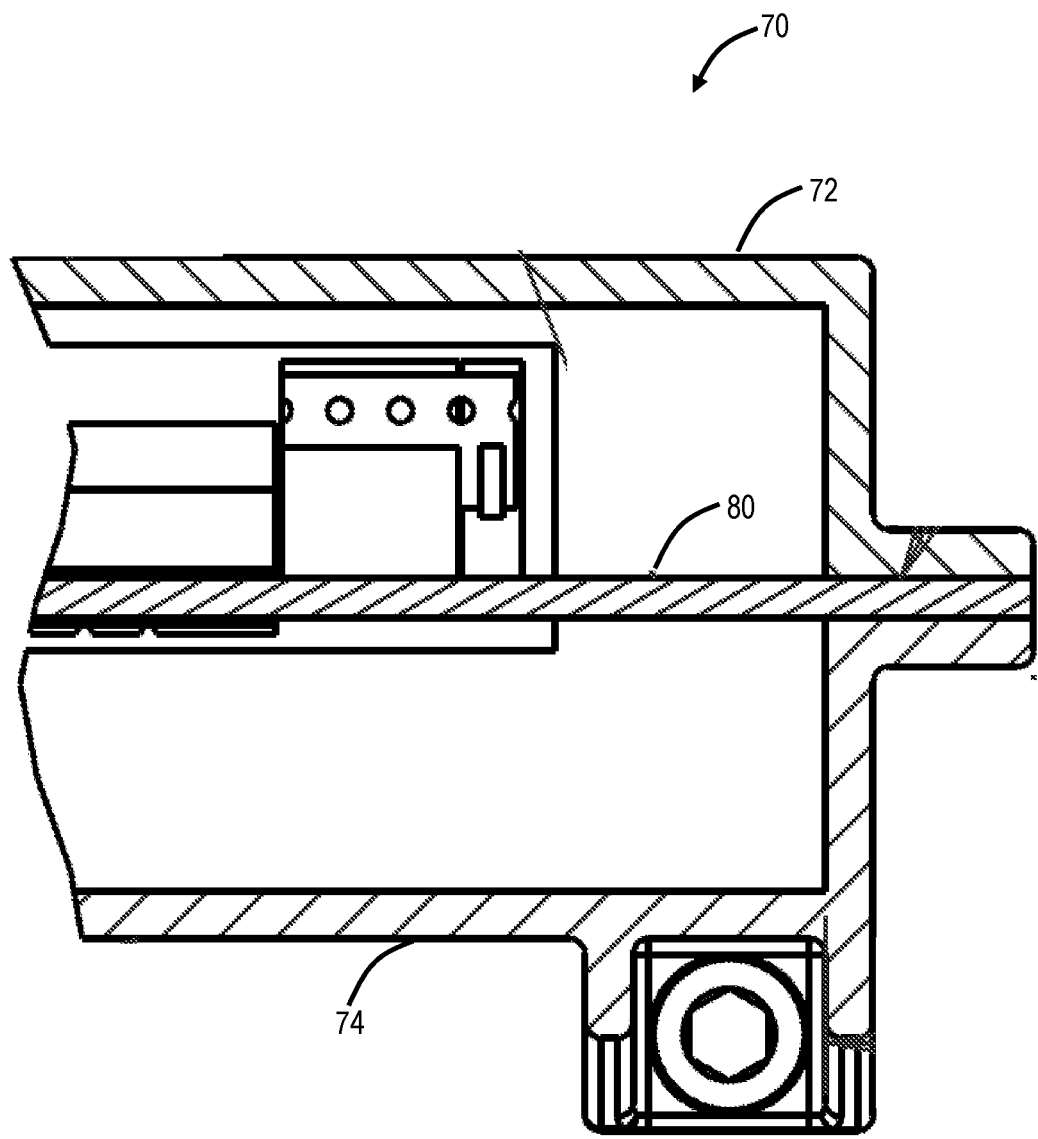
FIG. 10 is a cross-sectional diagram of a housing associated with the line, client, and switch modules in the hardened optical platform.
Figure 11:
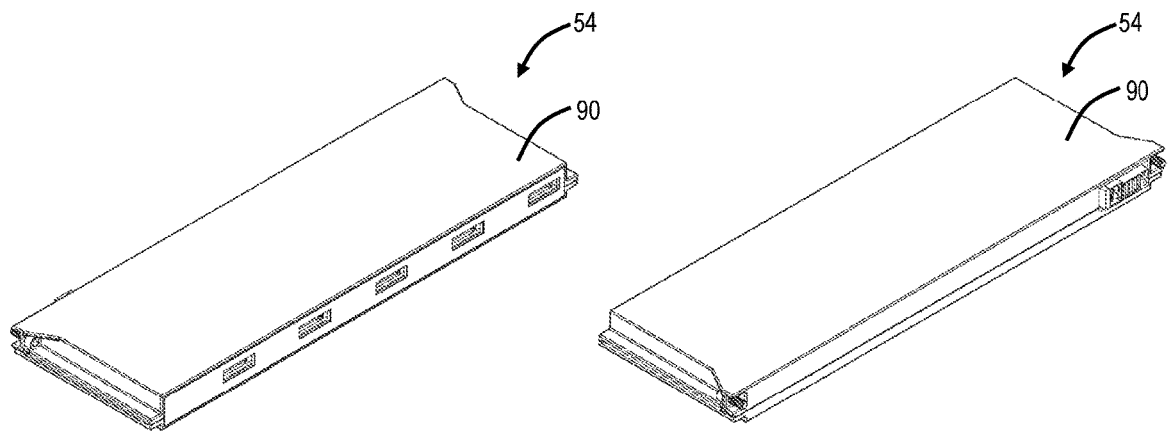
FIG. 11 is a perspective diagram of a front and rear view of the switch module in the hardened optical platform.
Figure 12:
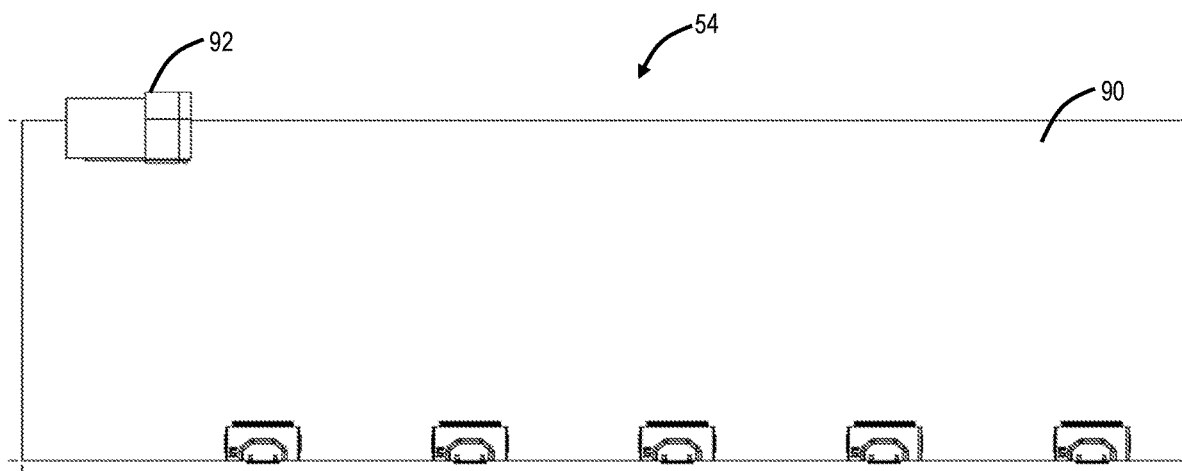
FIG. 12 is a perspective diagram of a top view of the switch module of FIG. 11.
Figure 13:
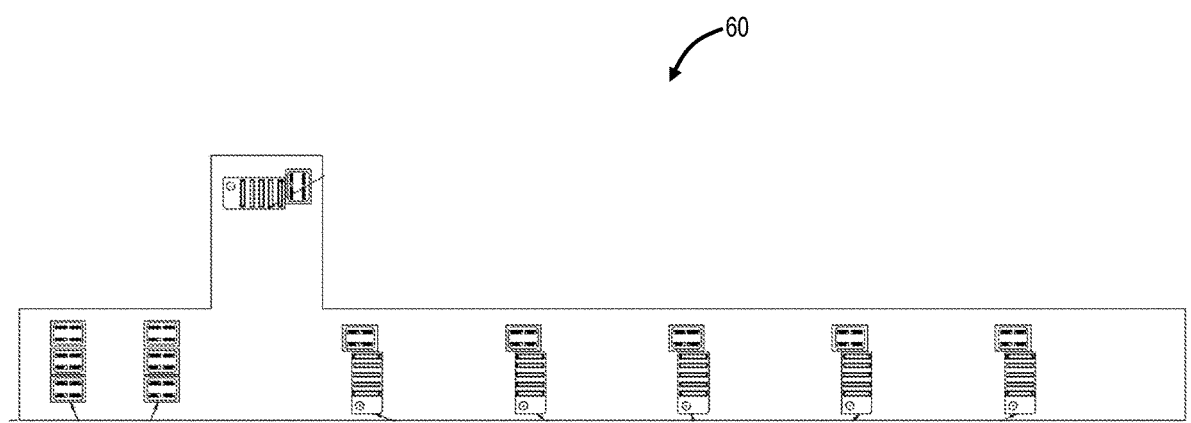
FIG. 13 is a diagram of a front view of a backplane in the hardened optical platform.

FIGS. 8-13 are diagrams of various modules 50, 52, 54 and a backplane 60 associated with the hardened optical platform 12. Specifically, FIG. 8 is a perspective diagram of a front and rear view of the line module 50, FIG. 9 is a perspective diagram of a front and rear view of the client module 52, FIG. 10 is a cross-sectional diagram of a housing 70 associated with the modules 50, 52, 54, FIG. 11 is a perspective diagram of a front and rear view of the switch module 54, FIG. 12 is a perspective diagram of a top view of the switch module 54, and FIG. 13 is a diagram of a front view of the backplane 60 in the hardened optical platform 12.

In this example, these modules can form the functionality of the hardened optical platform 12 in FIG. 1, namely 100G/200G from the optical access network 18 and 10G or the like connections to end users, HFC, etc. In an embodiment, the hardened optical platform 12 can support two-line modules 50, such as for working and protection (1+1, ring, mesh, etc.), and three client modules 52 for client interfaces. Again, other embodiments are contemplated. Both the line module 50 and the client module 52 support pluggable optical modules 100 with novel thermal management as described herein.

The line modules 50 each can include a single pluggable optical module 100A. The pluggable optical module 100A can be a coherent pluggable module, such as ACO, DCO, etc. The client modules 52 each can include eight Small Form Factor Pluggable (SFP) pluggable optical modules 100B. For example, assume the SFP pluggable optical modules 100B each operate at 10G, with three client modules 52, the hardened optical platform 12 can have 240G of client interfaces. The pluggable optical module 100A can be 200G+ via coherent optics. The switch module 54 is configured to provide packet switching between the line modules 50 and the client modules 52. Thus, the hardened optical platform 12 can support 200G+ packet switching in an outside plant configuration.

In FIGS. 8 and 9, the modules 50, 52 are fully enclosed modules with the housing 70 having a first side 72, a second side 74, a front faceplate 76, and a rear thermal contact surface 78. Thus, a Printed Circuit Board (PCB) 80 with associated electronics and optics for the modules 50, 52 are fully closed via the housing 70. The housing 70 can be referred to as a clamshell, and the housing 70 can conduct heat from the PCB 80 to the rear thermal contact surface 78. As shown in FIG. 10, the PCB 80 is "sandwiched" between the first side 72 and the second side 74 of the housing 70 for heat removal. The housing 70 is configured to cover various components in the associated module 50, 52, 54.

The rear thermal contact surface 78 can be thermally conductive to the heat fins 36 on the rear portion of the enclosure 30. Thus, one means of heat transfer can be at the rear of the hardened optical platform 12. The modules 50, 52, 54, 56 can be positioned to adjoin the enclosure 30 via a mechanical connection that provides a large contact force and low thermal impedance. As will be discussed in greater detail below, the mechanical connection can be actuated to move the modules 50, 52, 54, 56 to increase the thermal impedance for operation of the modules 50, 52, 54, 56 in low ambient temperature conditions.

In FIGS. 11 and 12, similar to the modules 50, 52, also includes a housing 90. The switch module 54 connects to the modules 50, 52 via a connector ribbon on the front side of each of the modules 50, 52, 54. Further, each of the modules 50, 52, 54 include rear-side connectors 92 which connect to the backplane 60 in FIG. 13. For example, the rear-side connectors 92 can provide power and telemetry connections whereas the connector ribbon can provide data connectivity. Again, other embodiments are contemplated.

The switch module 54 is arranged perpendicular to the other modules 50, 52 and runs along the length of the enclosure 30 to facilitate connection to the modules 50, 52. This minimizes the length any signal must travel to the switch module 54. Further, the connections 96 can be a high-speed signal cable to connect the modules, reducing or eliminating the need for the backplane 60. Also, the size of the switch module 54 and the high-speed signal cable pitch can be chosen such that the same cable can be used to interconnect different types of modules.

In FIG. 7, connections 96 are shown on the front side between the modules 50, 52 and the switch module 54. Although connections between the modules 50, 52, 54 may be made entirely via the backplane 60, FIG. 7 illustrates the addition of very short, high speed signal cables, namely the connections 96. The connections 96 can be a more efficient approach of data transfer than the backplane. In this implementation, the connectors 92 at the rear of the modules 50, 52 can be reduced or eliminated, allowing the surface of the rear thermal contact surface 78 in contact with the outdoor enclosure 30 to be enlarged. This further improves the heat transfer to the outside enclosure 30.

Figure 14:
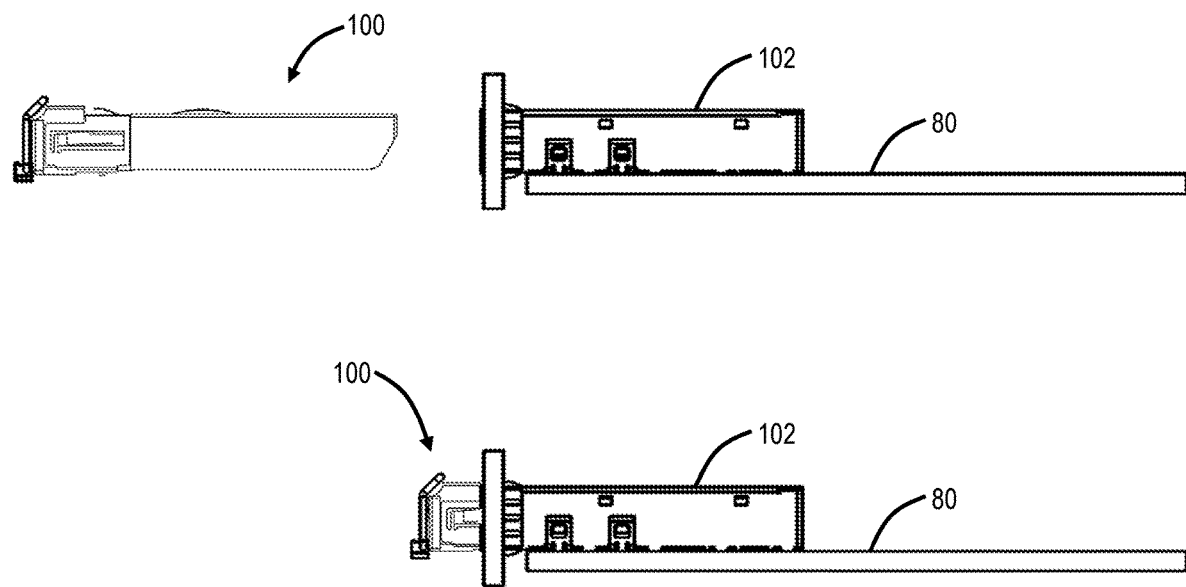
FIG. 14 is a diagram of a pluggable optical module inserted into a cage on a Printed Circuit Board (PCB)

In FIG. 14, a pluggable optical module 100 can be inserted into an optic carrier, such as cage 102 mounted on a PCB 80 within a housing, such as housing 70 disclosed above. One or more thermal interfaces can be used to maintain an operating temperature of the pluggable optical module 100 below a maximum operating temperature. However, to maintain the operating temperature of the pluggable optical module 100 above a minimum operating temperature and to preheat the pluggable optical module 100 to initiate operation, the relationship between the thermal interface and the pluggable optical module 100 is changed.

Figure 15:
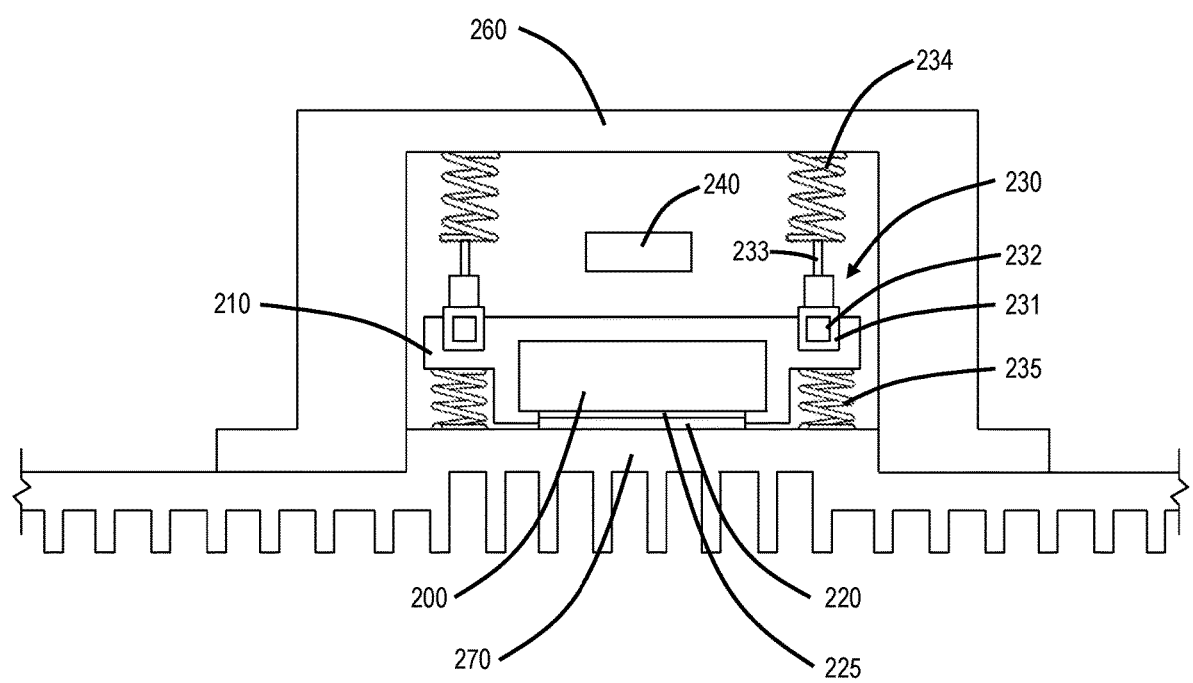
FIG. 15 is a perspective diagram of a thermal control system and pluggable optical module inserted into an optical carrier in a first position.
Figure 16:
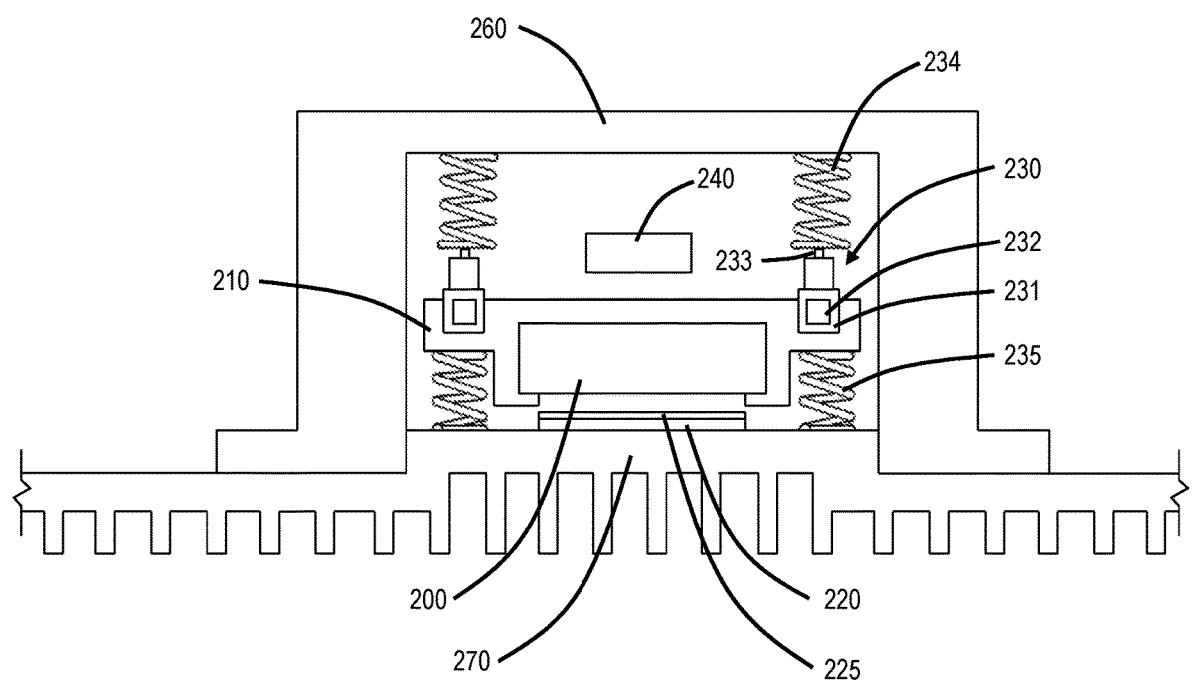
FIG. 16 is a cross-sectional diagram of a thermal control system and pluggable optical module inserted into the optical carrier in a second position.

Pluggable Optical Modules and Thermal Management in the Optical Telecom Platform FIGS. 15 and 16 are diagrams of actuated positions of the optic carrier 210 and the pluggable optical module 200 for low thermal resistance (FIG. 15) and for high thermal resistance (FIG. 16).

In FIG. 15, the module carrier 210 holds the pluggable optical module 200 in thermal contact with a thermal interface 220, which has low thermal resistance for dissipating heat. The thermal interface 220 can dissipate heat directly or indirectly to the enclosure 270. The thermal interface 220 can be one or a combination of a thermal interface material, a heat sink, a heat pipe, vapor chambers, and the like that transfer heat away from the pluggable optical module 200. The thermal interface 220 can include a contact layer 225, such as a foil covering, to prevent sticking and adhesion between the thermal interface 220 and the pluggable optical module 200.

As can be seen in FIG. 15, when the temperature is above an activation temperature, the pluggable optical module 200 is positioned such that the pluggable optical module 200 is in thermal contact with the thermal interface 220.

As can be seen in FIG. 16, at or about an activation temperature, one or more actuators 230 actuate to change a position of the pluggable optical module 200 relative to the thermal interface 220 to separate the pluggable optical module from the thermal interface 220, resulting in one or all of a reduced thermal contact between the pluggable optical module 200 and the thermal interface 220, the formation of an air gap 205 between the pluggable optical module 200 and the thermal interface 220, an increase in an average height of the air gap 205 between the pluggable optical module 200 and the thermal interface 220, and a thermal resistance between the pluggable optical module 200 and the thermal interface 220 is different based on a position of the pluggable optical module relative to the thermal interface, such as an increased thermal resistance when the temperature is below the activation temperature relative to the thermal resistance when the temperature is above the activation temperature.

The activation temperature is a predetermined temperature that can be a minimum desired operating temperature of the module, a threshold temperature that is above a minimum operating temperature of the module, a threshold minimum external temperature, a threshold temperature that is passed while external temperatures are dropping to the minimum external temperature, a threshold internal enclosure temperature, or the like. The activation temperature can also be a temperature range that is at or about a predetermined temperature. For example, a control material of a thermostatic actuator can expand and contract rapidly within a select temperature range. While the control material expands and contracts within the select temperature range, actual actuation may occur at any point within this range.

Actuation such that the pluggable optical module 200 moves may thus occur at or about the activation temperature, such as at a temperature within the select temperature range of rapid expansion and contraction of the control material.

The module carrier 210 can be supported by one or more contact springs 234 and one or more return springs 235. When the temperature is above the activation temperature the contact springs 234, the return springs 235, and the actuators 230 are configured such that the spring force of the contact springs 234 is greater than the spring force of the return springs 235, causing the module carrier 210 to be pressed towards and the pluggable optical module 200 to be pressed onto the thermal interface 220 resulting in a lower thermal resistance between the pluggable optical module 200 and the thermal interface 220.

When the temperature reaches the activation temperature the actuator 230 is actuated and the contact springs 234, the return springs 235, and the actuators 230 are configured such that the spring force of the contact springs 234 is less than the spring force of the return springs 235, causing the module carrier 210 and the pluggable optical module 200 to be pushed away from the thermal interface 220 until an equilibrium is reached between the contact springs 234 and the return springs 235.

When the temperature is below the activation temperature the contact springs 234, the return springs 235, and the actuators 230 are configured such that the spring forces are in an equilibrium. With this equilibrium, the module carrier 210 and the pluggable optical module 200 are separated from the thermal interface 220.

A gantry frame 260 can be attached to the enclosure 270 with the optic carrier 210 being positioned within the gantry frame 260. The contact springs 234 can be positioned between the gantry frame 260 and the optic carrier 210 such that the gantry frame 260 is connected to the optic carrier 210 via the contact springs 234. The return springs 235 can be positioned between the enclosure 270 and the optic carrier 210 such that the enclosure 270 is connected to the optic carrier 210 via the return springs 235.

An actuator 230 can be positioned at one of the interface between each contact spring 234 and the optic carrier 210, the interface between each contact spring 234 and the gantry frame 260, the interface between each return spring 235 and the optic carrier 210, or the interface between each return spring 235 and the enclosure 270. Other configurations of the one or more actuators 230, the one or more contact springs 234, the one or more return springs 235, the optic carrier 210, the gantry frame 260, and the enclosure 270 are also contemplated.

Each actuator 230 may be a thermostatic actuator, such as a wax motor. Each actuator 230 can include a piston 233 and a control material 232, such as wax, that can expand/contract at the actuation temperature. As such a material may expand/contract at a narrow temperature range, the actuation temperature may be a predetermined temperature range at which the control material 232 expands/contracts. The control material 232 can expand and cause the piston 233 to extend or can contract and cause the piston 233 to retract. By so doing, each actuator 230 can compress the spring 234, 235 that it is attached to in order to actuate the position of the optic carrier 210 and pluggable optical module 200 as described above.

A body 231 of each actuator 230 that holds the control material 232 can be embedded in the optic carrier 210, the gantry frame 260, or the enclosure 270 and thus the expansion/contraction of the control material 232 can occur based on a temperature of the component in which the body 231 is embedded. For example, when the body 231 is embedded in the optic carrier 210, the control material 232 can have a temperature at or similar to that of the pluggable optical module 200 due to the thermal conductivity of the optic carrier 210. A material for the control material 232 can be selected that has an activation temperature (or temperature range) that is slightly above the minimum operating temperature of the pluggable optical module 200. A temperature slightly above the minimum operating temperature is an activation temperature that will be far enough above the minimum operating temperature such that the pluggable optical module 200 cannot reach the minimum operating temperature before actuation to separate the pluggable optical module 200 from the thermal interface 220 occurs.

A heater 240 can be positioned to provide heat to the pluggable optical module 200. For example, the heater 240 can pre-heat the pluggable optical module 200 to raise the temperature of the pluggable optical module 200 above the minimum operating temperature. The heater 240 can be a resistor/heater circuit, or the like.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, processor, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A thermal control system for pluggable optics in an optical telecom platform, the thermal control system comprising:
    a thermal interface configured to dissipate heat from a pluggable optical module in the optical telecom platform; and
    one or more actuators configured to change a position of the pluggable optical module relative to the thermal interface based on temperature such that a thermal resistance between the pluggable optical module and the thermal interface is different based on a position of the pluggable optical module relative to the thermal interface, wherein the optical telecom platform operates at a temperature range that requires both cooling and heating the pluggable optical module.

2. The thermal control system of claim 1, wherein the one or more actuators is configured to cause the pluggable optical module to be pressed against the thermal interface when the temperature is above an activation temperature and to cause the pluggable optical module to move such that the pluggable optical module is separated from the thermal interface when the temperature is below the activation temperature.

3. The thermal control system of claim 1, wherein the thermal interface comprises a thermal interface material configured to be in direct or indirect contact with an enclosure of the optical telecom platform, and comprises a contact layer to prevent adhesion between the thermal interface and the pluggable optical module.

4. The thermal control system of claim 1, wherein the one or more actuators each comprises a thermostatic actuator configured to actuate at or about an activation temperature.

5. The thermal control system of claim 1, wherein the one or more actuators each include a body and a control material held within the body, the body being embedded in an optic carrier that holds the pluggable optical module, and the control material being a material that expands and contracts at or about an activation temperature.

6. The thermal control system of claim 1, further comprising
    one or more contact springs configured to push the pluggable optical module towards the thermal interface; and
    one or more return springs configured to push the pluggable optical module away from the thermal interface, wherein
    when the temperature is above the activation temperature the one or more contact springs, the one or more return springs, and the one or more actuators are configured such that a spring force of the one or more contact springs is greater than a spring force of the one or more return springs, causing the pluggable optical module to be pressed onto the thermal interface, and
    when the temperature reaches at or about an activation temperature the one or more actuators is actuated and the one or more contact springs, the one or more return springs, and the one or more actuators are configured such that the spring force of the one or more contact springs is less than the spring force of the one or more return springs, causing the pluggable optical module to be pushed away from the thermal interface until an equilibrium is reached between the spring forces of the one or more contact springs and the one or more return springs.

7. The thermal control system of claim 6, further comprising
    a gantry frame configured to attach to an enclosure of the optical telecom platform, wherein
    the one or more contact springs are configured to connect the optic carrier, via the one or more actuators, to the gantry frame, and the one or more return springs are configured to connect the optic carrier to the enclosure.

8. A method for thermally controlling a pluggable optical module in an optical telecom platform, the method comprising:
    providing a thermal interface configured to dissipate heat from a pluggable optical module in the optical telecom platform;
    providing one or more actuators configured to change a position of the pluggable optical module relative to the thermal interface; and
    actuating the one or more actuators based on temperature to change the position of the pluggable optical module such that a thermal resistance between the pluggable optical module and the thermal interface is different based on a position of the pluggable optical module relative to the thermal interface, wherein the optical telecom platform operates at a temperature range that requires both cooling and heating the pluggable optical module.

9. The method of claim 8, wherein said actuating comprises:
    pressing the pluggable optical module against the thermal interface when the temperature is above an activation temperature; and
    causing the pluggable optical module to move such that the pluggable optical module is separated from the thermal interface when the temperature is below the activation temperature.

10. The method of claim 8, further comprising providing a contact layer on the thermal interface to prevent adhesion between the thermal interface and the pluggable optical module.

11. The method of claim 8, further comprising providing a control material held within a body of the each of the one or more actuators, the body being embedded in an optic carrier that holds the pluggable optical module, wherein the control material is a material that expands and contracts at or about the activation temperature.

12. The method of claim 8, further comprising
    providing one or more contact springs configured to push the pluggable optical module towards the thermal interface; and
    providing one or more return springs configured to push the pluggable optical module away from the thermal interface, wherein
    when the temperature is above the activation temperature the one or more contact springs, the one or more return springs, and the one or more actuators are configured such that a spring force of the one or more contact springs is greater than a spring force of the one or more return springs, causing the pluggable optical module to be pressed onto the thermal interface, and
    when the temperature reaches at or about an activation temperature the one or more actuators is actuated and the one or more contact springs, the one or more return springs, and the one or more actuators are configured such that the spring force of the one or more contact springs is less than the spring force of the one or more return springs, causing the pluggable optical module to be pushed away from the thermal interface until an equilibrium is reached between the spring forces of the one or more contact springs and the one or more return springs.

13. The method of claim 12, further comprising providing a gantry frame configured to attach to the enclosure of the optical telecom platform, wherein the one or more contact springs connect the optic carrier, via the one or more actuators, to the gantry frame, and the one or more return springs connect the optic carrier to the enclosure.

14. An optical telecom platform, comprising:

a module carrier configured to receive a pluggable optical module;

a thermal interface configured to dissipate heat from a pluggable optical module held by the module carrier;

one or more actuators configured to change a position based on temperature of the module carrier and the pluggable optical module relative to the thermal interface such that a thermal resistance between the pluggable optical module and the thermal interface is different based on a position of the pluggable optical module relative to the thermal interface; and a housing enclosing the module carrier, wherein the housing covers the module carrier with the pluggable optical module, the thermal interface, and the one or more actuators, with respect to airflow, wherein the optical telecom platform operates at a temperature range that requires both cooling and heating the pluggable optical module.

15. The optical telecom platform of claim 14, wherein the one or more actuators is configured to cause the optic carrier to press the pluggable optical module against the thermal interface when the temperature is above an activation temperature and to cause the optic carrier to move resulting in the pluggable optical module being separated from the thermal interface when the temperature is below the activation temperature.

16. The optical telecom platform of claim 14, wherein the thermal interface comprises a thermal interface material configured to be in direct or indirect contact with an enclosure, and comprises a contact layer to prevent adhesion between the thermal interface and the pluggable optical module.

17. The optical telecom platform of claim 14, wherein the one or more actuators each comprises a thermostatic actuator configured to actuate at or about an activation temperature.

18. The optical telecom platform of claim 14, wherein the one or more actuators each include a body and a control material held within the body, the body being embedded in an optic carrier that holds the pluggable optical module, and the control material being a material that expands and contracts at or about an activation temperature.

19. The optical telecom platform of claim 14, further comprising one or more contact springs configured to push the pluggable optical module towards the thermal interface; and one or more return springs configured to push the pluggable optical module away from the thermal interface, wherein when the temperature is above the activation temperature the one or more contact springs, the one or more return springs, and the one or more actuators are configured such that a spring force of the one or more contact springs is greater than a spring force of the one or more return springs, causing the pluggable optical module to be pressed onto the thermal interface, and when the temperature reaches at or about an activation temperature the one or more actuators is actuated and the one or more contact springs, the one or more return springs, and the one or more actuators are configured such that the spring force of the one or more contact springs is less than the spring force of the one or more return springs, causing the pluggable optical module to be pushed away from the thermal interface until an equilibrium is reached between the spring forces of the one or more contact springs and the one or more return springs.

20. The optical telecom platform of claim 19, further comprising a gantry frame configured to attach to the enclosure, wherein the one or more contact springs are configured to connect the optic carrier, via the one or more actuators, to the gantry frame, and the one or more return springs are configured to connect the optic carrier to the enclosure.

* * * * *